(12) United States Patent
Liu

(10) Patent No.: US 12,368,440 B2
(45) Date of Patent: Jul. 22, 2025

(54) SYSTEMS FOR AND METHODS OF CLOCK FREQUENCY MONITORING

(71) Applicant: Avago Technologies International Sales Pte. Limited, Singapore (SG)

(72) Inventor: Renfei Liu, Santa Margarita, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 94 days.

(21) Appl. No.: 18/308,479

(22) Filed: Apr. 27, 2023

(65) Prior Publication Data

US 2024/0364346 A1     Oct. 31, 2024

(51) Int. Cl.
*H03K 21/02* (2006.01)
*G01R 23/00* (2006.01)
*G06F 1/10* (2006.01)

(52) U.S. Cl.
CPC .......... *H03K 21/02* (2013.01); *G01R 23/005* (2013.01); *G06F 1/10* (2013.01)

(58) Field of Classification Search
None
See application file for complete search history.

(56) References Cited

U.S. PATENT DOCUMENTS 7,482,880 B2 * 1/2009 Herrin .................... H03C 3/095
                                                           331/11

FOREIGN PATENT DOCUMENTS

GB       2 253 315 A      9/1992
JP     2009-250808 A    10/2009

OTHER PUBLICATIONS

European Search Report on non-Foley case related to U.S. Appl. No. 18/308,479 DTD Sep. 16, 2024.

* cited by examiner

*Primary Examiner* — Cassandra F Cox
(74) *Attorney, Agent, or Firm* — Foley & Lardner LLP

(57) ABSTRACT

Systems and methods relate a device for monitoring or tracking clock frequency. The device can include a first circuit configured to receive a reference clock signal and provide a first signal in response to a first number of cycles of the reference clock signal, and a second circuit configured to receive a sample clock signal and provide a second signal in response to the first signal. The second signal is indicative of a second number of cycles of the sample clock signal occurring during the first number of cycles of the reference clock signal. The device can also include a third circuit configured to determine a ratio of a first frequency of the reference clock signal to a second frequency of the sample signal using the second signal.

20 Claims, 6 Drawing Sheets

SYSTEMS FOR AND METHODS OF CLOCK FREQUENCY MONITORING

FIELD OF THE DISCLOSURE

This disclosure generally relates to systems for and methods of clock monitoring including but not limited to systems for and methods of high-precision clock frequency calculation and tracking operations.

BACKGROUND OF THE DISCLOSURE

In the last few decades, the market for electronic devices has grown by orders of magnitude, fueled by the use of portable devices, and increased connectivity, data transfer and data storage in all manners of devices. Many modern electronic devices rely upon clock signals. For example, systems on a chip (SoCs) often use one or more clock signals to realize wide range of functionalities and cover different modes of operation. As data speeds reach the multi-giga bit per second ranges, accuracy associated with clock signals (e.g., data clock signals) can affect system operations. For example, poor accuracy related to the frequency of a clock signal can adversely affect communication performance and prevent systems from meeting performance specifications.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
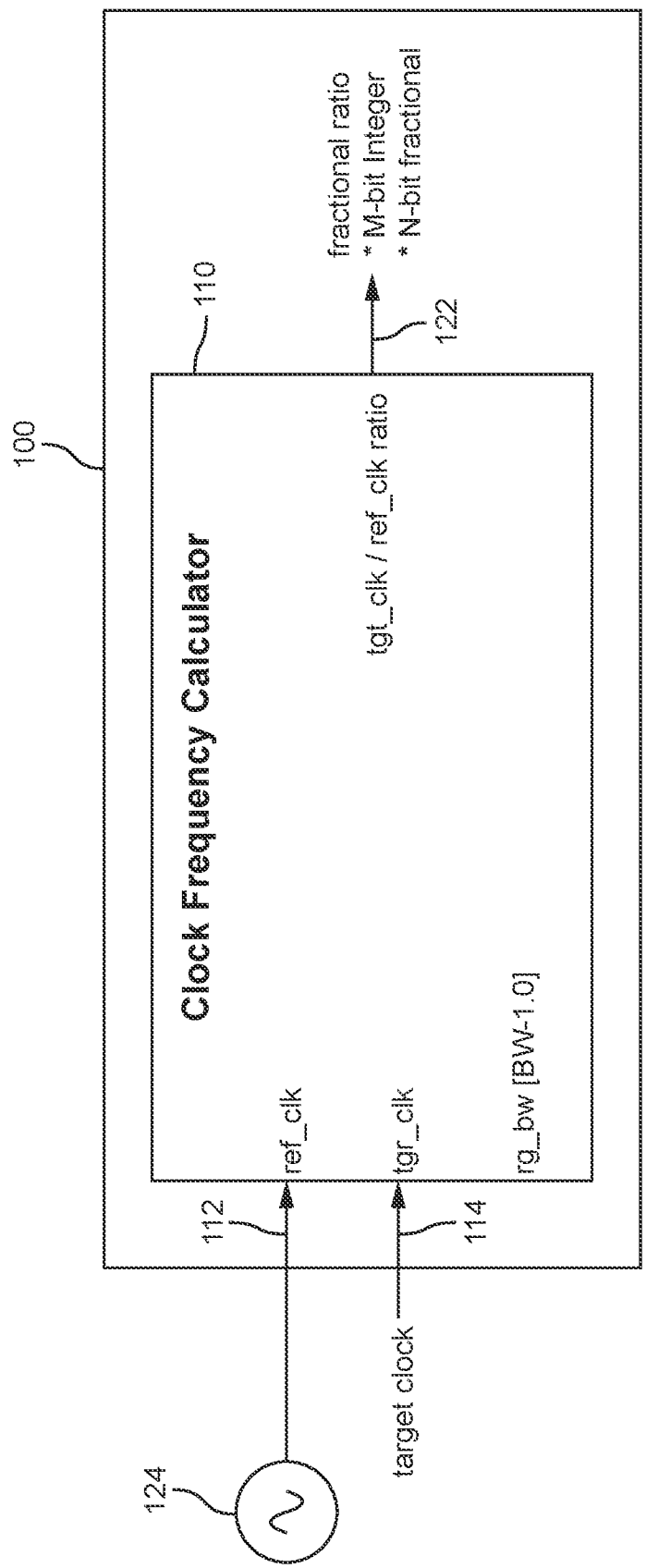
FIG. 1 is a block diagram depicting an exemplary system including a clock frequency calculator, according to one or more embodiments.

The details of various embodiments of the methods and systems are set forth in the accompanying drawings and the description below.

DETAILED DESCRIPTION

For purposes of reading the description of the various embodiments below, the following descriptions of the sections of the specification and their respective contents may be helpful. Systems and methods described herein may be used in a network environment, storage environment, communication environment, control environment, sensor environment, and/or computing environment which use clock signals according to some embodiments. Systems for and methods of clock monitoring are used to ensure high-precision clock signals at high frequency in some embodiments. Although this disclosure can reference aspects of detailed design(s), performances, and specification(s), the disclosure is in no way limited to these aspects.

In some embodiments, systems and methods monitor clock domains or signals for integrated circuits (e.g., packaged ICs or SoCs). The systems and methods can be employed in any clock monitoring applications and may be applied to track processing, voltage, and temperature (PVT) variations. The systems and methods can be employed to monitor on-die ring oscillator speed. The systems and methods can be employed on IC dies, SoCs, printed circuit board components, stand-alone equipment, computing devices, etc.

In some embodiments, the systems and methods perform high-precision clock frequency measurement and continuous tracking of one or more signals. In some embodiments, the accuracy of high quality clock signals used in communication systems are monitored. For example, clock signals provided by 18-bit resolution PLLs used in coherent optical communication applications are monitored for proper frequency. In some embodiments, an on-die circuit or apparatus measures clock frequency with accuracy. In some embodiments, the systems and methods are employed to continuously track frequency drifts and changes on chip or off chip.

In some embodiments, the systems and methods provide greater precision than systems that directly compare a target clock signal to a known reference clock signal. In some embodiments, the systems and methods do not require prior knowledge of the frequency ratio between the target clock signal and the known reference clock signal. In some embodiments, the systems and methods provide adaptive clock monitoring for wide use cases. In some embodiments, the systems and methods is less of an ad hoc and more of a systematic solution.

In some embodiments, the systems and methods do not rely upon phase locked loop (PLL) solution and uses integer dividers (e.g., predominantly integer dividers in the circuit). In some embodiments, systems and methods meet frequency resolution, range, and low-jitter requirements that are very difficult to realize using conventional PLL cores. In some embodiments, a clock frequency calculator is provided in silicon products, application specific circuits (ASIC), digital signal processors, programmable logic circuits, SoCs, or standard products. In some embodiments, a clock frequency calculator provides very fine ratio-based frequency resolution, uses small silicon area, and is scalable and portable to newer integrated circuit processes. In some embodiments, systems and methods of clock frequency calculation are used in modern high-speed and power-efficient data communication and processing systems, including but not limited to any backplane, serial deserializer (SERDES), Ethernet physical layer (PHY), optical transceiver, digital signal processor (DSP) module in coherent transceivers, input/output (I/O) interfaces, multicore processors, memories, power management, and wireless transceivers.

Some embodiments relate to a device. The device includes a first counter configured to receive a reference clock signal and provide a first signal in response to a first number of cycles of the reference clock signal, and a second counter configured to receive a sample clock signal and provide a second signal in response to the first signal. The second signal is indicative of a second number of cycles of the sample clock signal occurring during the first number of cycles of the reference clock signal. The circuit is to determine a ratio of a first frequency of the reference clock signal to a second frequency of the sample signal in response to the first signal and the second signal.

In some embodiments, the device includes a calculator configured to subtract the second signal at a first time from the second signal at a second time to provide a difference value. In some embodiments, the circuit is configured to determine the ratio in response to the difference value. In some embodiments, the circuit is configured to determine the ratio in response to samples of the difference value over time.

In some embodiments, the circuit includes an infinite impulse response filter. In some embodiments, the circuit determines the ratio according to the following equation: $Y(n)/(K+1)=(Q((X(n)-Y(n-1))+Y(n-1)))/(K+1)$ where $Y(n)/(K+1)$ is the ratio at a sample n, $X(n)$ is the difference at a sample n, and $Y(n-1)/(K+1)$ is the ratio at a sample n−1. In some embodiments, the circuit determines the ratio according to the following equation: $Y(n)=(Q(alpha((X(n)-Y(n-1)))+Y(n-1))/(K+1)$ where $Y(n)/(K+1)$ is the ratio at a sample n, $X(n)$ is the difference at a sample n, Q is a quantization function, alpha is programmable bandwidth, and $Y(n-1)/K+1$ is the ratio at a sample n−1.

In some embodiments, the second counter is configured as a free running counter. In some embodiments, the first counter is configured as a periodic counter. In some embodiments, the difference value is an integer value.

Some embodiments relate to a method. The method includes providing a first signal in response to a first number of cycles of the reference clock signal, providing a second signal in response to the first signal, where the second signal is indicative of a second number of cycles of a sample clock signal occurring during the first number of cycles of the reference clock signal, and determining a difference between a first sample of the second signal at a first time and second sample of the second signal at a second time. The method also includes determining a ratio of a first frequency of the reference clock signal to a second frequency of the sample signal in response to the difference.

Sample may refer to a value of a signal (e.g., data) taken at a particular time in some embodiments. In some embodiments, the ratio is related to the following expression: $Q(X(n)-Y(n-1))+Y(n-1)))/(K+1)$ where $Y(n)/(K+1)$ is the ratio provided as a fractional value at a sample n, $X(n)$ is the difference at a sample n, and $Y(n-1)/(K+1)$ is the ratio at a sample n−1.

In some embodiments, the first signal is provided by a first counter is configured as a periodic counter. In some embodiments, the difference value is an integer value the second signal is provided by a second counter configured as a free running counter. In some embodiments, the ratio is determined using an alpha parameter, the alpha parameter, wherein the alpha parameter affects settling time. In some embodiments, the alpha parameter s adjusted dynamically.

Some embodiments relate to a device including a first circuit configured to receive a reference clock signal and provide a first signal in response to a first number of cycles of the reference clock signal, and a second circuit configured to receive a sample clock signal and provide a second signal in response to the first signal. The second signal is indicative of a second number of cycles of the sample clock signal occurring during the first number of cycles of the reference clock signal. The device also includes a third circuit configured to determine a ratio of a first frequency of the reference clock signal to a second frequency of the sample signal using the second signal.

In some embodiments, the first circuit, the second circuit and the third circuit are provided on a same integrated circuit die that provides the sample clock signal. In some embodiments, the first circuit, the second circuit and the third circuit are provided on a separate integrated circuit die from another integrated circuit die provides the sample clock signal.

In some embodiments, the third circuit includes a calculator circuit configured to provide a difference between a first sample of the second signal at a first time and second sample of the second signal at a second time.

Prior to discussing specific embodiments of the present solution, the methods and systems described herein can be utilized with various computing, storage communication or network devices. The network devices can include or be in communication with a SAN, security adapters, or ethernet converged network adapter (CAN). The devices can include access points, one or more wireless communication devices, a network hardware components including but not limited to laptop computers, tablets, personal computers, wearable devices, vehicles (e.g., automobiles, drones, smart vehicles, robotic units, etc.), sensors, media systems, gaming systems, communication systems and/or cellular telephone devices. The networks can be ad hoc networks, infrastructure wireless networks, wired networks, a subnet environments, etc. in some embodiments. Network components include but are not limited to routers, gateways, switches, bridges, modems, system controllers, appliances, etc.

The network connections may include any type and/or form of network and may include any of the following: a point-to-point network, a broadcast network, a telecommunications network, a data communication network, a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Aspects of the operating environments and components described above will become apparent in the context of the systems and methods disclosed herein.

With reference to FIG. 1, a system 100 is any type of electronic device or group of devices. System 100 can be provided on an integrated circuit (IC) die (e.g., on one or more IC dies). System 100 can be used in any electronic and/or optical application. System 100 can be used in and/or with the devices and networks discussed above.

In some embodiments, the system 100 includes a clock frequency processor or clock frequency calculator 110 having a reference clock signal input 112, a target clock signal input 114, and a ratio output 122. System 100 can include a number of clock frequency calculators similar to clock frequency calculator 110 (e.g., one for each monitored clock signal). In some embodiments, clock frequency calculator 110 is configured to receive a target clock signal at a target clock signal input 114, a reference clock signal at a reference clock signal input 112, and provide a ratio of the frequency of the a reference clock signal and the target clock signal at ratio output 122. The target clock signal may refer to a clock signal that is to be monitored or measured with respect to the reference clock signal in some embodiments. The target clock signal may refer to a clock signal that is used to monitor or measure the target clock signal in some embodiments. The reference clock signal and the target clock signals have different frequencies from each other in some embodiments. In some embodiments, the ratio is a fractional value that is the ratio of the frequency of the reference clock signal and the target clock signal (e.g., represented by an M-bit integer portion and N-bit fraction portion, where M and N are any integers). The ratio can be used to make adjustments to the target clock signal, perform other corrective actions, or provide a warning.

In some embodiments, clock frequency calculator 110 uses a bandwidth parameter or setting (e.g., BW). The bandwidth parameter can be input to or generated by clock frequency calculator 110. The bandwidth parameter controls the measurement precision and convergence time for the ratio at the ratio output 122. The bandwidth parameter is a digital value that allows measurement speed and precision to by finely adjusted in some embodiments. The bandwidth parameter can be adjusted as clock frequency calculator 110 operates.

In some embodiments, reference clock signal input 112 is coupled to a signal source 124. Signal source 124 provides the a reference clock signal, Signal source 124 is a crystal integrated circuit that provides a reference frequency signal at a frequency in some embodiments. Signal source 124 can be any type of device for providing a reference clock signal (e.g., a square wave or sinusoidal oscillator, a phase locked loop based source, a ring oscillator, etc.). The reference clock signal can be provided at a frequency of 5 Megahertz (MHz) to 400 MHZ (e.g., 100 MHZ) in some embodiments. The reference clock signal and the target clock signal can be a square wave or other signal for driving gates, processors or other logic provided at a frequency in some embodiments. The target clock signal can have a frequency between 1 MHz and 6 Gigahertz (GHz) in some embodiments. In some embodiments, the target clock signal has a frequency less than a frequency of the target clock signal. In some embodiments, the target clock signal has a frequency more than a frequency of the target clock signal. The reference clock signal and target clock signal can have any duty cycle (e.g., approximately 50 percent). In some embodiments, Signal source 124 provides the reference clock signal a relatively stable, accurate frequency (e.g., suitable for measuring the frequency of the target clock signal). The reference clock signal is provided by an accurate and precise clock signal source at a known frequency in some embodiments.

In some embodiments, the clock frequency calculator 110 is a high speed macro, processor, unit, circuit, logic, or other implementation that can provide the ratio of the frequency of the reference clock signal and the target clock signal in response to the reference clock signal and the target clock signal. In some embodiments, the clock frequency calculator 110 advantageously does not require integer relationships between the reference clock signal and the target clock signal. In some embodiments, the clock frequency calculator 110 uses a slower reference clock signal (e.g., 5 MHz) to precisely measure a high speed target clock signal (e.g., 210.33 MHZ) with minimal hardware and computation cost.

In some embodiments, the ratio determined by the clock frequency calculator 110 can be a fractional reading expanded in accordance with application requirements. The fractional reading can be expanded almost infinitely in some embodiments.

Figure 2:
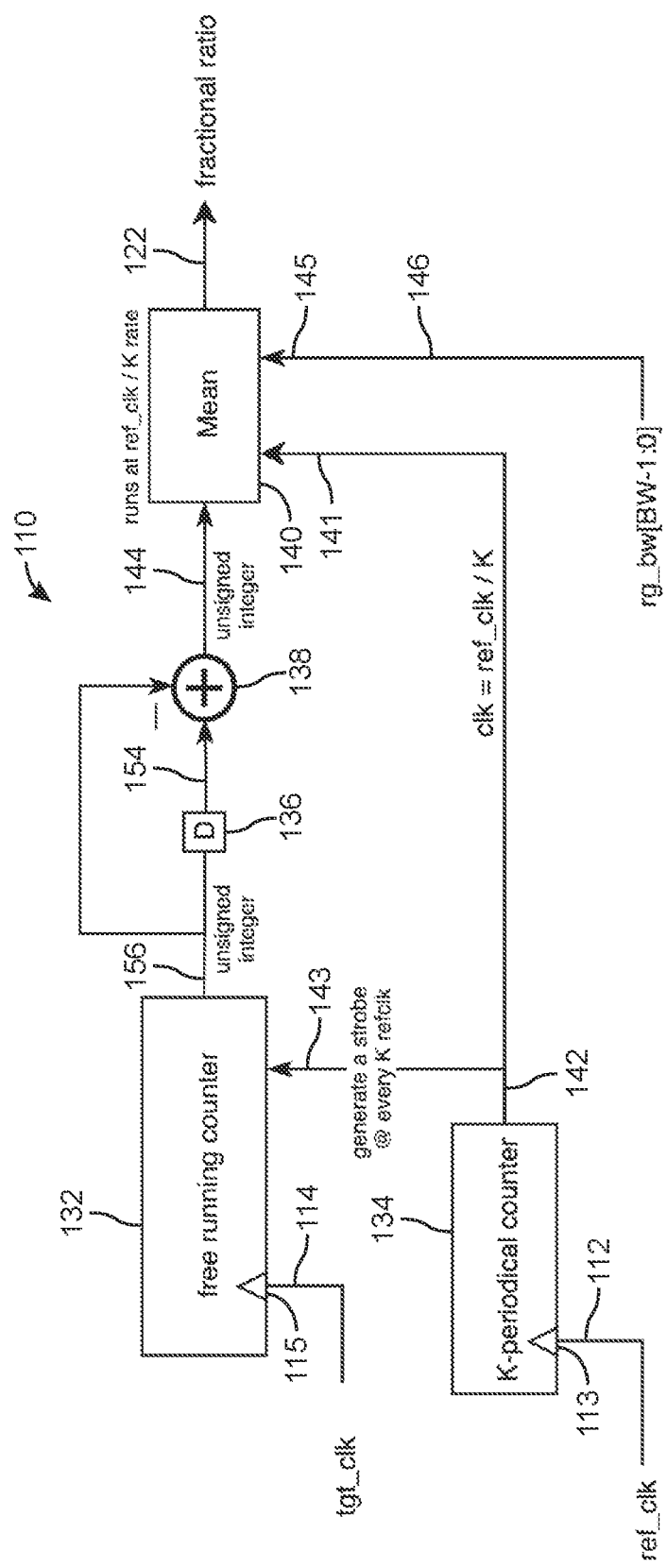
FIG. 2 is a more detailed block diagram of the clock frequency calculator illustrated in FIG. 1, according to one or more embodiments.

With reference to FIG. 2, the clock frequency calculator 110 includes a counter 132, a counter 134, a delay circuit 136, a summer or calculator 138, and a mean tracking module 140. Counter 134 includes a clock input 113 coupled to reference clock signal input 112, and counter 132 includes a clock input 115 coupled to target clock signal input 114. Counters 132 and 134 are coupled to mean tracking module 140 which provides the ratio of the frequency of the reference clock signal and the target clock signal at ratio output 122.

In some embodiments, counter 134 is a K-periodic counter which provides a strobe signal at output 142 every K cycles of the reference clock signal. Counter 134 can be any type of circuit for providing the strobe signal. In some embodiments, counter 134 is a sequential digital logic circuit. Counter 132 can utilize an array of flip-flops connected in a cascade. Counter 134 can utilize a reset input, a set input, a load input, an enable input, etc. A counter may refer to any type of circuit for providing a periodic signal in response to a number of cycles of one or more other signals (e.g., a clock signal). A cycle may refer to a period of a signal or an amount of is the amount of time between two pulses of the signal (e.g., between every leading edge or every falling edge of a square wave clock signal) in some embodiments.

Counter 134 provides the strobe signal at every fixed interval T (K cycles of the reference clock signals where K is an integer) in some embodiments. The strobe signal can be a pulse or square wave signal in some embodiments. The value K can be a fixed value or a programmed value in some embodiments. The value K can be a pre-determined constant value. The strobe signal is a divided version that is used as a control signal for counter 132 at input 143 and mean tracking module 140 at input 141.

In some embodiments, counter 132 is a free running counter which provides a signal at output 156 in response to the target clock signal at clock input 115 and the strobe signal at input 143. A free running counter may refer to a counter that counts to a maximum number overflows to zero and begins counting up again in some embodiments. Counter 132 is configured to generate an output that loops from 0 to N-1, where N is the maximum count from which counter 132 ends the count and loops back to 0. Counter 132 can be any type of circuit for providing the signal at output 156. In some embodiments, counter 132 is a sequential digital logic circuit. Counter 132 can utilize an array of flip-flops connected in a cascade. Counter 132 can utilize a reset input, a set input, a load input, an enable input, etc. Counters 132 and 134 can be a macro, unit, circuit, logic, or other implementation that can provide the counting operations as described above in some embodiments.

Counter 132 can be configured to count the pulses of the target clock signal until a pulse of the strobe signal is provided to the input 143. In some embodiments, counter 132 counts the number of pulses during the time interval T or during K clock cycles of the reference clock signal. The number of pulses of the target clock signal is related to frequency of the target clock signal (e.g., pulses per second equals frequency in Hz). The number of pulses of the reference clock signal is related to frequency of the reference clock signal (e.g., pulses per second equals frequency in Hz). Counter 132 provides the count value of the number of pulses counted at output 156 and is reset to zero by the pulse of the strobe signal that is provided to the input 143 in some embodiments. The count value provided at output 156 of counter 132 is an unsigned integer value in some embodiments. The count value at output 156 may vary during operation. For example, the count value may vary due to clock domain crossing (CDC) associated with the reference clock signal and the target clock signal. CDC can occur whenever data is transferred from a flip flop or latch driven by one clock signal to a flip flop or latch driven by another clock signal.

Calculator 138 is configured as subtractor in some embodiments. Calculator 138 subtracts the digital value at output 156 from the digital value from delay circuit 136 using modular N subtraction in some embodiments. Delay circuit 136 provides a K delay so that the maximum value at output 56 (e.g., the value after K cycles) is subtracted from the previous maximum value at output 56 (the value after the preceding K cycles). Delay circuit 136 can be any circuit for providing the appropriate sample selection or for calculator 138. Calculator 138 subtracts the value at input 148 from output 156 from the value at input 154 from delay circuit 136 and provides a difference value to input 149. The difference value is an unsigned integer value in some embodiments. In some embodiments, calculator 138 provides modular-N subtraction which always generates a positive value. In some embodiments, delay circuit 136 is a latch based storage element clocked by the strobe signal and stores the value at the output 156 of counter 132 every K cycles.

Mean tracking module 140 is coupled to calculator 138 and receives the difference value at input 149 in some embodiments. Mean tracking module 140 provides a fractional value (e.g., Y(n)) indicative of the frequency of the target signal to the frequency of the reference signal. In some embodiments, mean tracking module 140 uses an averaging process with an iterative approach. The fractional value multiplied by the frequency of the reference signal can be used to determine the frequency of the target signal in real time or near real time in some embodiments. In some embodiments, the fractional value is a mean or average of the integer values (e.g., the difference values) provided by calculator 138. In some embodiments, the mean tracking module 140 is configured as an infinite impulse response (IIR) filter that calculates average target clock cycle count during the time interval T. In some embodiments, mean tracking module 140 performs the following equation: $Y(n)= Q(alpha (X(n)-Y(n-1)))+Y(n-1)$ where $Y(n)$ is the fractional real-valued average clock cycle count at sample n, Q is a quantization function, alpha is programmable bandwidth (e.g., BW), $X(n)$ is the difference value provided at output 144 (e.g., the value provided as an input to the IIR filter), and $Y(n-1)$ is the fractional value real valued average clock cycle count at sample n−1 in some embodiments. In some embodiments, $Y(n)/(K+1)$ is the fractional value at output 122 at sample n. $Y(n)$ can be calculated using $X(n)$ and previous values of $Y(n)$.

The quantization function provides a practical fraction limit for the value $Y(n)$ (e.g., 10-30 bits, 20 bits) in some embodiments. Quantization may refer to an operation the process of reduces a larger set of input values to output values in a smaller set, often with a finite number of elements in some embodiments. Rounding and truncation are examples of quantization. The value alpha is selectable or fixed and affects the tracking speed (e.g., settlement time) and settled measurement precision. The higher the value the faster the settling time in some embodiments. The value alpha can be a number from 0 to 1 in some embodiments. A settling time may refer to a time period for a value to reach convergence in some embodiments. In some embodiments, the settling time is a time required for the ratio to reach a steady state within a given tolerance band. An infinite impulse response filter may refer to an electronic filter (e.g., a digital filter) that has an infinite impulse response in some embodiments. An alpha parameter may refer to a bandwidth value that affect measurement precision and convergence time in some embodiments.

In some embodiments, the ratio $Y(n)/(K+1)$ provided by mean tracking module 140 can be represented by the following equation: $Y(n)/(K+1)$=Frequency of target clock signal/frequency of reference clock which is equal to $(r_{int}[7:0]+r_{fraction}[19:10]*2^{-20})/(K+1)$, where $r_{int}$ [7:0] represents the integer portion of $Y(n)$ (e.g., 8 bits), $r_{fraction}$ [19:0] represents the fraction portion of $Y(n)$ (e.g., 20 bits) and K equals the number of cycles of the reference clock signal in the strobe signal (if $Y(n)$ is a twos complement number). The number of bits discussed above are exemplary. In some embodiments, precision of $Y(n)$ and $Y(n)/(K+1)$ can be increased by increasing the data width (e.g., the alpha value) of the fixed point representation of $Y(n)$ and settling speed can be increased by decreasing the data width (e.g., the alpha value) of the fixed point representation of $Y(n)$. In some embodiments, mean tracking module 140 can be a macro, unit, circuit, logic, a processor, digital filter, or other implementation that can provide the fractional value calculation operations as described above in some embodiments. Mean tracking module can include digital accumulators, adder, subtractors, multipliers, filters, dividers and other logic for calculation $Y(n)/(K+1)$ at the output 122 in some embodiments. In some embodiments, the real value average count of cycles of the sample clock signal in a cycle of the strobe signals is calculated using the output of calculator 138. A real value average count may refer to an average value expressed at least in part as a fraction in some embodiments.

Figure 3:
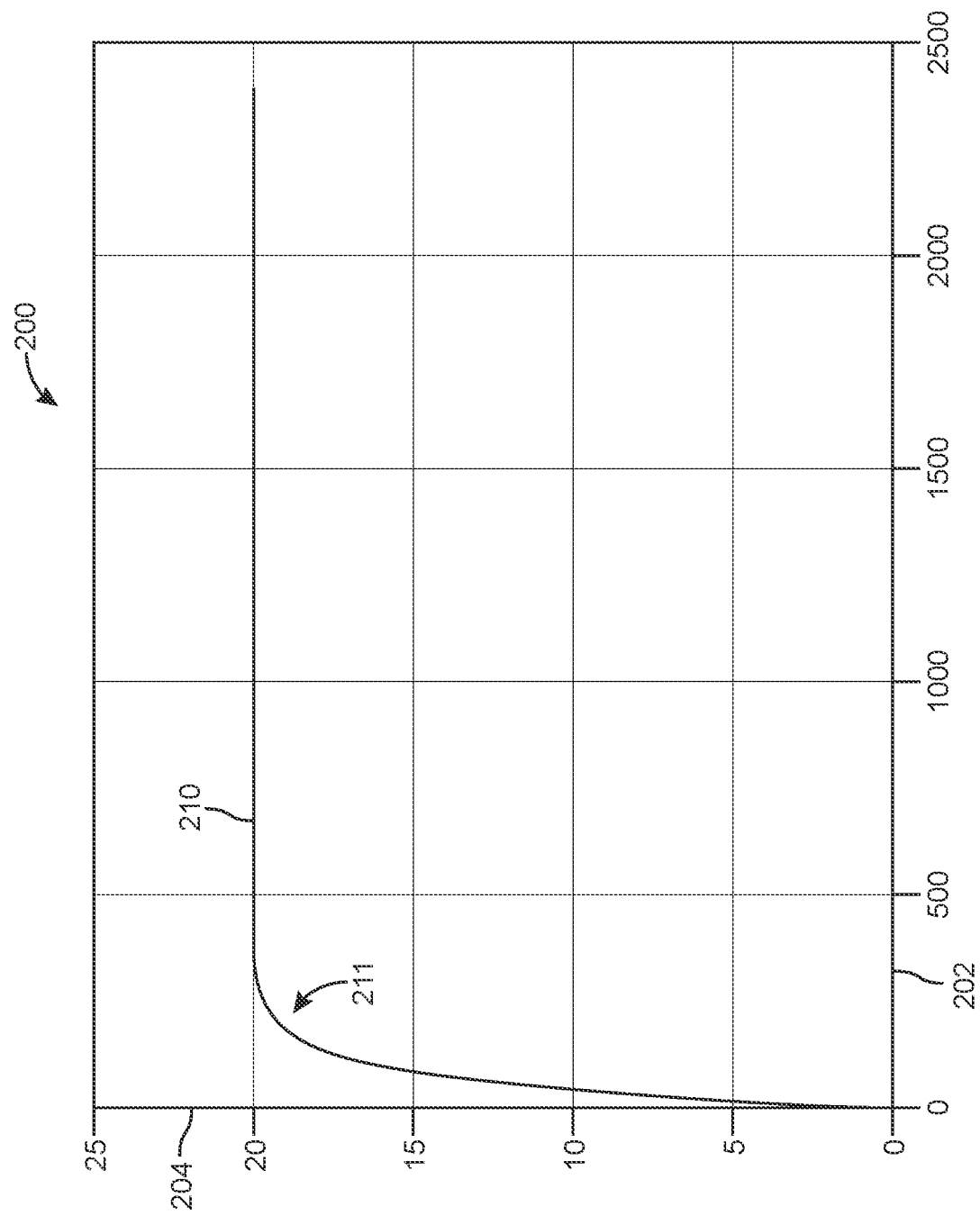
FIG. 3 is a waveform diagram showing a ratio of a target clock signal to a reference clock signal frequency calculated by the clock frequency calculator illustrated in FIG. 1 versus cycle sample number when the reference clock frequency is lower than the target clock frequency, according to one or more embodiments.

With reference to FIG. 3, a wave form 210 represents $Y(n)/(K+1)$ calculated by clock frequency calculator 110 (FIG. 1) for a target clock signal having a frequency of 100 MHz, a K value of 11 and a reference clock signal having a frequency of 1.111 M Hz. The frequency of the target clock signal is faster or more than the frequency of the reference clock signal. An X axis 202 represents time or a number of K clock cycles of the reference clock signal, and a Y axis 204 represents the ratio (e.g., $Y(n)/(K+1)$). The expected ratio is 20.088888 and the actual value 20.088867. The use of frequency calculator 110 allows a more accurate understanding of the frequency of the target clock signal (e.g., 0.000105 percent more accurate than the expected frequency) in some embodiments. The wave form 210 reaches a convergence 211 at approximately 300 K cycles of the reference clock signal indicating measurement settlement in some embodiments.

Figure 4:
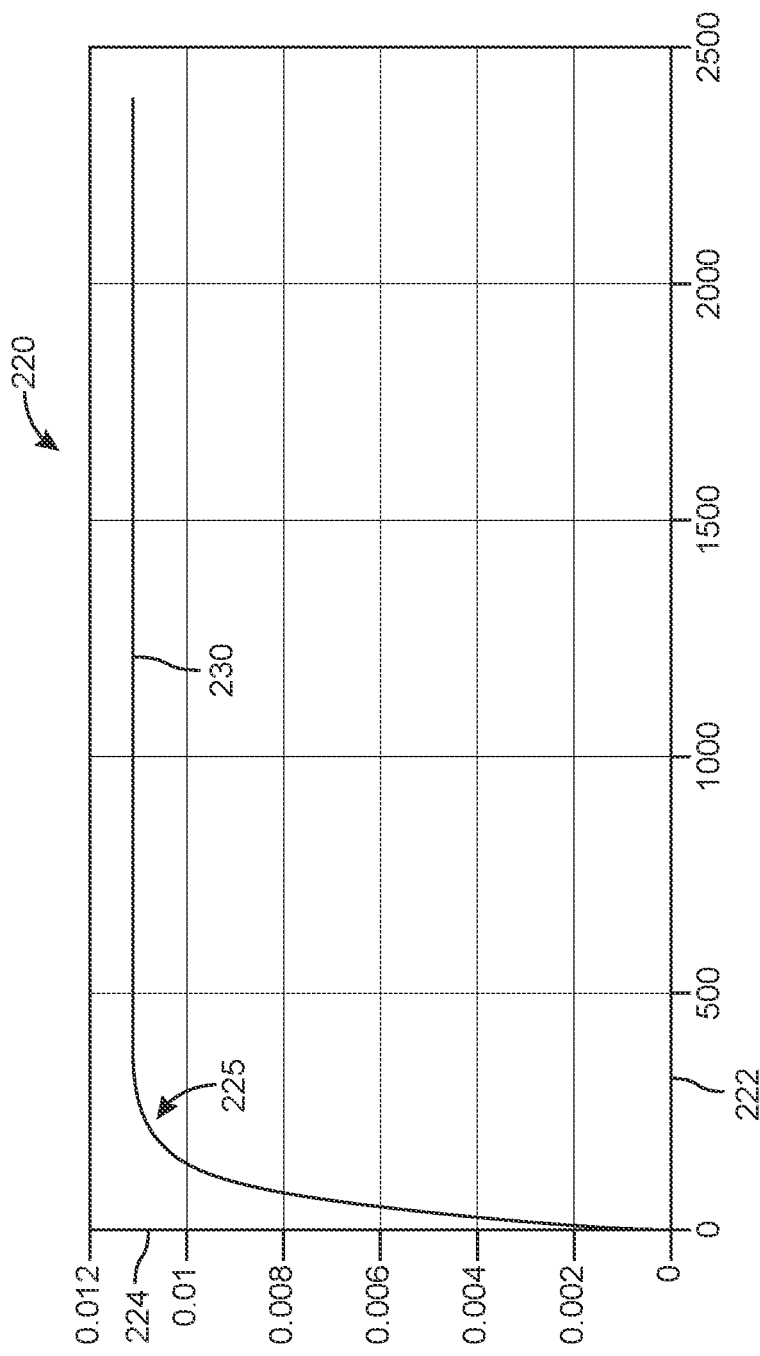
FIG. 4 is a waveform diagram showing a ratio of a target clock signal frequency a reference clock signal frequency calculated by the clock frequency calculator illustrated in FIG. 1 versus cycle sample number when the reference clock frequency is higher than the target clock frequency, according to one or more embodiments.

With reference to FIG. 4, a wave form 220 represents $Y(n)/(K+1)$ for a target clock signal having a frequency of 1.111 MHz, a K value of 249 and a reference clock signal having a frequency of 100M Hz. The frequency of the target clock signal is slower or less than the frequency of the reference clock signal. An X axis 224 represents number of K clock cycles of the reference clock signal, and a Y axis 224 represents the ratio (e.g., $Y(n)/(K+1)$). The expected ratio is 0.01111 and the actual value is 0.01110. The use of frequency calculator allows a more accurate understanding of the frequency of the target clock signal (e.g., 0.09 percent more accurate than the expected frequency) in some embodiments. The wave form 220 reaches a convergence 225 at approximately 300 K cycles of the reference clock signal indicating measurement settlement in some embodiments.

Figure 5:
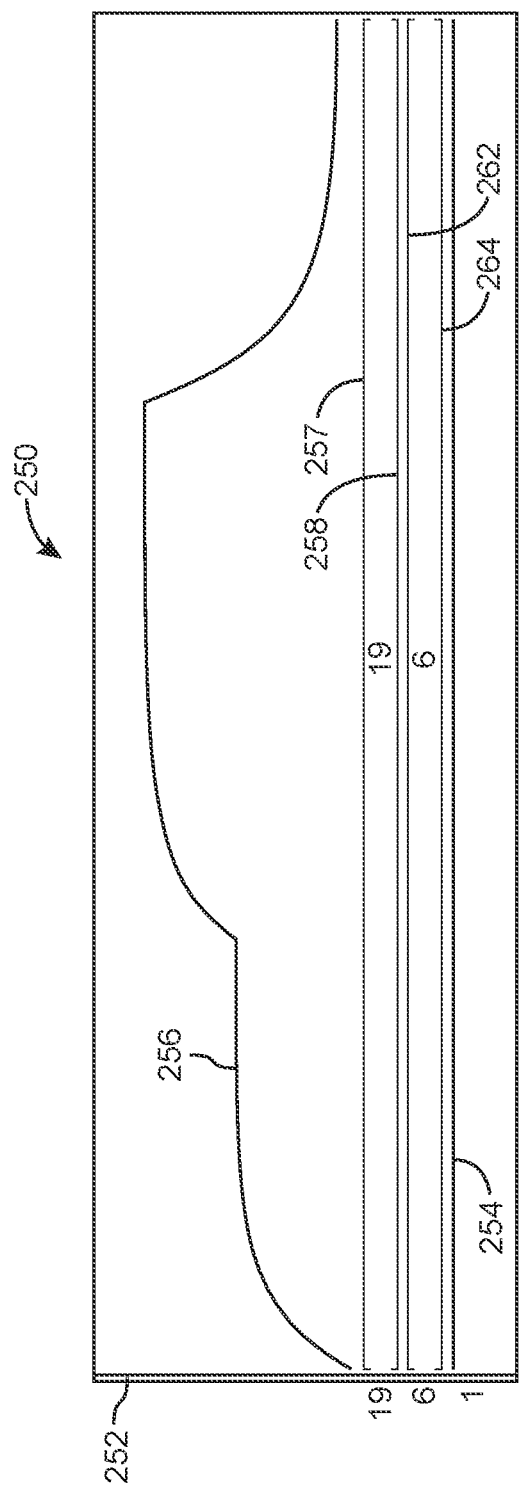
FIG. 5 is a timing diagram showing a ratio of a target clock signal frequency to a reference clock signal frequency calculated by the clock frequency calculator illustrated in FIG. 1 versus cycle sample number when using varied target clock signal frequencies, according to one or more embodiments.

With reference to FIG. 5, a wave form 250 represents Y(n)/(K+1)) for a target clock signal that is dynamically changing. The target clock signal has frequency that changes from a frequency associated with a level 257, a level 259, and a level 261. Wave form 250 is associated with a K value of 19 and an alpha value bandwidth setting of 6 which represents a number from 0 to 1. Level evel 257 represents the ratio (e.g., Y(n)/(K+1)). An X axis 252 represents number of K clock cycles of the reference clock signal, and a Y axis 254 represents the ratio (e.g., Y(n)/(K+1)). The K value is represented by wave form 258, the alpha value is represented by waveform 262, and an enable signal for the clock frequency calculator 110 (FIG. 1) is represented by waveform 264. The enable signal can turn the clock frequency calculator 110 on and off in some embodiments.

Figure 6:
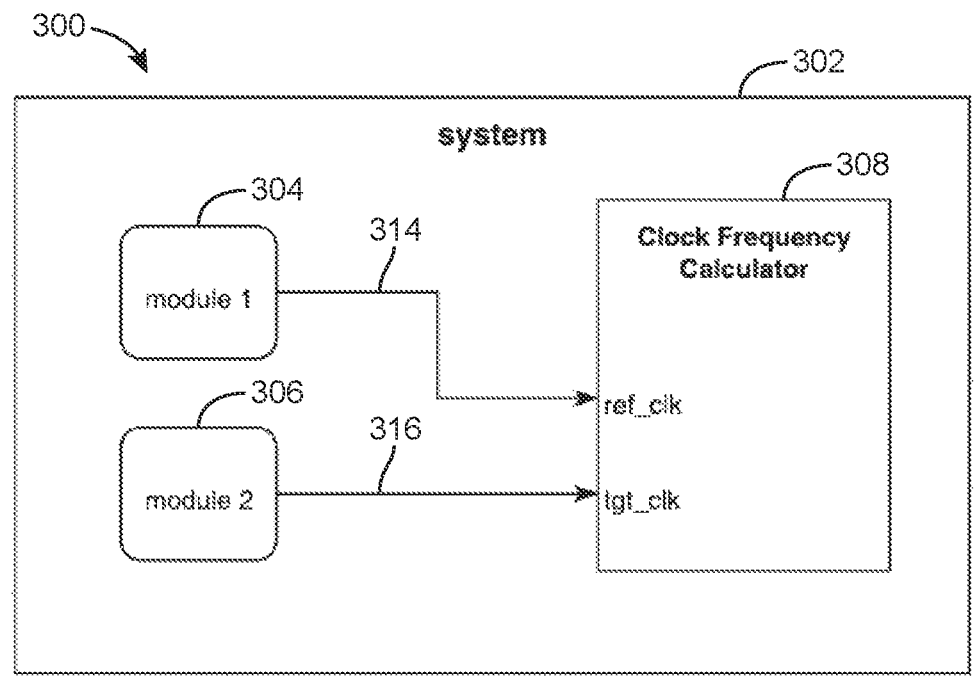
FIG. 6 is a block diagram depicting an exemplary system including a clock frequency calculator disposed in the system, according to one or more embodiments.

With reference to FIG. 6, a system 300 includes any type of electronic device or group of devices. System 100 can be provided on an integrated circuit (IC) die. System 300 can be used in any electronic and/or optical application. System 300 can be used in and/or with the devices discussed above.

In some embodiments, the system 300 includes a clock frequency calculator 308 coupled to a module 304 providing the reference clock signal at output 314 and a module 306 providing the target clock signal at output 316. Clock frequency calculator 308 is similar to clock frequency calculator 110 (FIG. 1) and is provided in the same IC package or substrate as system 300. Modules 304 and 306 can be provided in the same IC package, IC die, or substrate as system 300 or be off chip devices.

Figure 7:
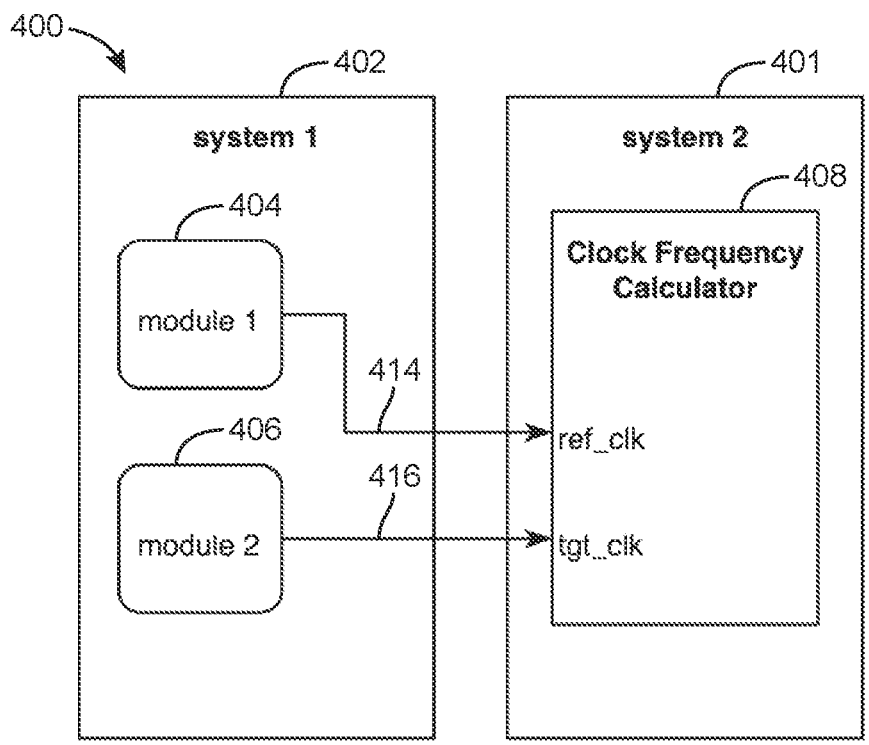
FIG. 7 is a block diagram depicting an exemplary system including a clock frequency calculator disposed external to the system, according to one or more embodiments.

With reference to FIG. 7, a system 400 includes any type of electronic device or group of devices and includes a system 402 and a system 401. System 401 includes a clock frequency calculator 408. System 402 can be provided on a different integrated circuit (IC) die than system 401. System 400 can be used in any electronic and/or optical application. System 400 can be used in and/or with the devices discussed above. Systems 401 and 402 can be in different IC packages or the same IC package. An integrated circuit die may refer to a chip or substrate that includes active integrated circuit devices in some embodiments. An integrated circuit package may refer to a device including one or more IC die housed in a package. An IC package can be a multichip package or a signal chip package in some embodiments.

In some embodiments, the clock frequency calculator 408 is coupled to a module 304 providing the reference clock signal at output 414 and a module 306 providing the target clock signal at output 416. Modules 404 and 406 are provided as part of system 402. Clock frequency calculator 408 is similar to clock frequency calculator 110 (FIG. 1) and is provided in the same IC package or substrate as system 401. Modules 404 and 406 can be provided in the same IC package or substrate as system 402 or be off chip devices. In some embodiments, module 404 is integrated with system 401 and module 404 is integrated with module 406 or vice versa.

A flip flop may refer a circuit element with two stable states that can be used to store binary data in some embodiments. A latch may refer to a circuit element that has two inputs and one output in some embodiments. A clock signal may refer to a signal used to drive or be applied to another circuit in some embodiments. A clock signal can be an electronic logic signal (voltage or current) which oscillates between a high and a low state at a frequency and is used to synchronize actions of digital circuits in some embodiments.

The clock signal can be applied to all storage devices, flip-flops and latches, and causes them all to change state simultaneously in some embodiments. A clock signal is produced by an electronic oscillator called a clock generator and can be in the form of a square wave with a 50% duty cycle. Circuits using the clock signal for synchronization may become active at either the rising edge, falling edge, or, in the case of double data rate, both in the rising and in the falling edges of the clock cycle. A clock signal can have a variable frequency in some embodiments. A reference clock signal may refer to a clock signal used as a reference for comparing to another clock signal in some embodiments. A sample clock signal may refer to a clock signal that is measured in some embodiments.

It should be noted that certain passages of this disclosure can reference terms such as "first" and "second" in connection with devices signals, data, inputs, channels, etc., for purposes of identifying or differentiating one from another or from others. These terms are not intended to merely relate entities (e.g., a first input and a second input) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components. In addition, the systems and methods described above can be provided as one or more computer-readable programs or executable instructions, programmable circuits, or digital logic embodied on or in one or more articles of manufacture. The article of manufacture can be a floppy disk, a hard disk, a CD-ROM, a flash memory card, a PROM, a RAM, a ROM, ASIC or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

I claim:

1. A device, comprising:
   a first counter configured to receive a reference clock signal and provide a first signal in response to a first number of cycles of the reference clock signal;
   a second counter configured to receive a sample clock signal and provide a second signal in response to the first signal, where the second signal is indicative of a second number of cycles of the sample clock signal occurring during the first number of cycles of the reference clock signal; and
   a circuit configured to determine a ratio of a first frequency of the reference clock signal to a second frequency of the sample clock signal in response to the first signal and the second signal.

2. The device of claim 1, further comprising a calculator configured to subtract the second signal at a first time from the second signal at a second time to provide a difference value.

3. The device of claim 2, wherein the circuit is configured to determine the ratio in response to the difference value.

4. The device of claim 2, wherein the circuit is configured to determine the ratio in response to samples of the difference value over time.

5. The device of claim 1, wherein the circuit comprises an infinite impulse response filter.

6. The device of claim 2, wherein the circuit determines the ratio according to a following equation: $Y(n)/(K+1)=(Q(X(n)-Y(n-1)+Y(n-1))/(K+1)$ where Q is a quantization function, $Y(n-1)/(K+1)$ is the ratio provided at a sample n, $X(n)$ is a difference at the sample n, $Y(n)$ is a real value average count of cycles of the sample clock signal in a cycle of the first signal at the sample n, K is the first number of the cycles of the reference clock signal, and $Y(n-1)$ is the real value average count of cycles of the sample clock signal in the cycle of the first signal at a sample n-1.

7. The device of claim 2, wherein the ratio is related to a following expression: $Y(n)=(Q(alpha (X(n)-Y(n-1))+Y(n-1))/(K+1)$ where $Y(n)/(K+1)$ is the ratio provided as a fractional value at a sample n, $X(n)$ is a difference at the sample n, Q is a quantization function, alpha is programmable bandwidth, $Y(n)$ is a real value average count of cycles of the sample clock signal in a cycle of the first signal at the sample n, K is the first number of the cycles of the reference clock signal, and $Y(n-1)$ is the real value average count of cycles of the sample clock signal in the cycle of the first signal at a sample n-1.

8. The device of claim 2, wherein the circuit determines real value average count of cycles of the sample clock signal in a cycle of the first signal in response to samples of the difference value and wherein the difference value is an integer value.

9. The device of claim 1, wherein the second counter is configured as a free running counter.

10. The device of claim 1, wherein the first counter is configured as a periodic counter.

11. A method comprising:
providing a first signal in response to a first number of cycles of a reference clock signal;
providing a second signal in response to the first signal, where the second signal is indicative of a second number of cycles of a sample clock signal occurring during the first number of cycles of the reference clock signal;
determining a difference between a first sample of the second signal at a first time and second sample of the second signal at a second time; and
determining a ratio of a first frequency of the reference clock signal to a second frequency of the sample clock signal in response to the difference.

12. The method of claim 11, wherein the ratio is related to a following expression $(Q(X(n)-Y(n-1))+Y(n-1))/(K+1)$ where Q is a quantization function, where $Y(n)/(K+1)$ is the ratio provided as a fractional value at a sample n, $X(n)$ is the difference at the sample n, K is the first number of the cycles of the reference clock signal, and $Y(n-1)/(K+1)$ is the ratio at a sample n-1.

13. The method of claim 11, the first signal is provided by a first counter configured as a periodic counter.

14. The method of claim 11, wherein the second signal is provided by a second counter configured as a free running counter.

15. The method of claim 11, wherein the ratio is determined using an alpha parameter, the alpha parameter, wherein the alpha parameter affects settling time.

16. The method of claim 15, wherein the alpha parameter is adjusted dynamically.

17. A device, comprising:
a first circuit configured to receive a reference clock signal and provide a first signal in response to a first number of cycles of the reference clock signal;
a second circuit configured to receive a sample clock signal and provide a second signal in response to the first signal, where the second signal is indicative of a second number of cycles of the sample clock signal occurring during the first number of cycles of the reference clock signal; and
a third circuit configured to determine a ratio of a first frequency of the reference clock signal to a second frequency of the sample clock signal using the second signal.

18. The device of claim 17, where the first circuit, the second circuit and the third circuit are provided on a same integrated circuit die that provides the sample clock signal.

19. The device of claim 17, where the first circuit, the second circuit and the third circuit are provided on a separate integrated circuit die from another integrated circuit die that provides the sample clock signal.

20. The device of claim 17, where the third circuit comprises a calculator circuit configured to provide a difference between a first sample of the second signal at a first time and second sample of the second signal at a second time.

* * * * *